United States Patent [19]  [11] Patent Number: 5,780,338
Jeng et al.  [45] Date of Patent: Jul. 14, 1998

[54] METHOD FOR MANUFACTURING CROWN-SHAPED CAPACITORS FOR DYNAMIC RANDOM ACCESS MEMORY INTEGRATED CIRCUITS

[75] Inventors: Erik S. Jeng; Tzu-Shih Yen, both of Taipei, Taiwan

[73] Assignee: Vanguard International Semiconductor Corporation, Hsin-Chu, Taiwan

[21] Appl. No.: 827,820

[22] Filed: Apr. 11, 1997

[51] Int. Cl.[6] .............................................. H01L 21/8242
[52] U.S. Cl. ...................... 438/253; 438/631; 438/649
[58] Field of Search .................................. 438/253, 396, 438/626, 631, 647, 648, 649

[56] References Cited

U.S. PATENT DOCUMENTS

| | | | |
|---|---|---|---|
| 5,294,561 | 3/1994 | Tanigawa | 438/253 |
| 5,346,844 | 9/1994 | Cho et al. | 438/253 |
| 5,391,511 | 2/1995 | Doan et al. | 437/49 |
| 5,399,237 | 3/1995 | Keswick et al. | 156/643 |
| 5,500,384 | 3/1996 | Melzner | 438/631 |

OTHER PUBLICATIONS

J. Givens et al. "Selective Dry Etching in a High Density Plasma for a O Seem Complementary Metal–Oxide–Semiconductor Technology", J. Vac Sci Technol. B 12(1), Jan./Feb. 1994, pp. 427–432.

*Primary Examiner*—Chandra Chaudhari
*Attorney, Agent, or Firm*—George O. Saile; Stephen B. Ackerman

[57] ABSTRACT

A method for manufacturing crown-shaped stacked capacitors on dynamic random access memory using a single photoresist mask to make the node contacts and capacitor bottom electrodes was achieved. After forming the FET gate electrodes from a first polysilicon layer and the bit lines from a second polysilicon layer, a thick planar BPSG and a hard mask composed of polysilicon or silicon nitride is deposited. Openings are etched in the hard mask and partially into the BPSG. Sidewall spacers, composed of $Si_3N_4$ or TEOS oxide, are formed in the openings and a special selective high density plasma etch and the etchant gas mixture of $O_2$, $CHF_3$, $CF_4$, CO, $C_4F_8$, and Ar is used to form the node contact openings in the BPSG to the FETs. A conformal third polysilicon layer is then deposited and a second masking material is used to define the bottom electrodes having a crown-shape in the BPSG openings. After removing the hard mask, the second masking material, and the BPSG between electrodes, an interelectrode dielectric layer is formed on the bottom electrodes. An $N^+$ doped fourth polysilicon layer is deposited to form the top electrodes and to complete the crown-shaped stacked capacitors.

32 Claims, 7 Drawing Sheets

FIG. 8

METHOD FOR MANUFACTURING CROWN-SHAPED CAPACITORS FOR DYNAMIC RANDOM ACCESS MEMORY INTEGRATED CIRCUITS

BACKGROUND OF THE INVENTION (1). Field of the Invention

This invention relates to an integrated circuit semiconductor device, and more particularly, to a method for fabricating crown-shaped stacked capacitors for dynamic random access memory (DRAM) using a single photoresist masking step and a selective plasma etch step for forming the capacitor node contact and capacitor, thereby reducing manufacturing costs.

(2). Description of the Prior Art

Dynamic random access memory (DRAM) devices are used for storing digital information on arrays of memory cells in the form of charge stored on a capacitor. Each memory cell consists of a single pass transistor and a single capacitor. The pass transistor is usually an N channel field effect transistor (FET), and the capacitor is formed either by etching a trench in the substrate, or by forming stacked capacitors by depositing and patterning conducting layers over and within the individual cell areas after fabricating the individual pass transistors. The stacked capacitors extending vertically upward require more processing to manufacture but, in general, the DRAM devices are desirable because of their overall lower manufacturing costs relative to other memory devices. However, it is still desirable to reduce processing complexity, and more specifically the number of photoresist masking steps to further reduce manufacturing costs.

The array of individual DRAM storage cells making up part of the DRAM circuit on the chip stores binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor, or built over the FET in the cell area as a stacked capacitor. However, as these volatile memory cell array density increases on the DRAM chip, the capacitor is reduced in size and it becomes increasingly difficult to store sufficient charge. Further, maintaining sufficient charge also requires more frequent refresh cycles which further slow the circuit performance. In recent years the difficulty in fabricating trenches with increased capacitor area, hence increased capacitance, has directed one to the fabrication of stacked capacitors which can be built vertically over each memory cell area. This allows one more latitude in designing the capacitor but, in general, also makes the process more complex and costly.

One method of forming an array of stacked capacitors for DRAM devices is described by T. T. Doan, U.S. Pat. No. 5,391,511 entitled "Semiconductor Processing Method of Producing an Isolated Polysilicon Lined Cavity and a Method of Forming a Capacitor." In this method a chemical mechanical polishing is used to polish back a polysilicon layer and thereby form a polysilicon lined cavity that can be used for forming stacked capacitors. Another related invention is by P. Keswick et al., U.S. Pat. No. 5,399,237, which teaches a method of using plasma etching and etchant gases such as $CF_3$, $CF_4$, $CHF_3$, $C_2F_6$, $C_3F_8$, $C_4F_8$ or $C_4F_{10}$ and a suitable carbon-oxygen gas, such as $CO$ or $CO_2$, to etch titanium nitride on a substrate. Another related reference by J. Givens et al., entitled "Selective Dry Etching in a High Density Plasma for 0.5 um Complementary Metal-Oxide-Semiconductor Technology," published in J. Vac. Sci. Technol. B 12(1), Jan/Feb 1994, pages 427–432 teaches a method of using high density plasma (HDP) etching to investigate the selective nature of etching oxide insulators to nitride films, and the selective etching of nitride to silicon and silicon oxide layers. The authors use an etchant gas of $C_2F_6$ to achieve a high etch rate ratio of oxide to nitride and a gas mixture of $CH_3F$ and $CO_2$ to achieve a high etch rate ratio of nitride to oxide for (HDP) etching.

There is still a strong need in the semiconductor industry to further improve upon fabricating stacked storage capacitors for DRAM cells while reducing the number of processing steps and photoresist masking levels for improved reliability and cost performance.

SUMMARY OF THE INVENTION

Accordingly, it is a principal object of this invention to provide a method for fabricating an array of crown-shaped stacked capacitors using a single masking step to make the node contacts and the stacked capacitors.

Another object of the present invention is to provide a method for using selective etching to form the node contacts and capacitors having a less stringent aspect ratio.

It is still another object of this invention to reduce the number of processing steps thereby providing a more cost effective manufacturing process.

The improved DRAM cells having an array of these crown-shaped stacked capacitors are formed using a single mask to etch the node contacts and at the same time form the bottom electrodes for the capacitors.

The method for fabricating dynamic random access memory (DRAM) cells having these crown-shaped stacked storage capacitors begins by providing an array of device areas on a semiconductor substrate, such as on a single crystal silicon substrate doped with a P-type conductive dopant (e. g., boron). The device areas are provided by forming a relatively thick field oxide surrounding and electrically isolating each device area. One method of forming the field oxide areas is by protecting the device areas from oxidation by depositing and patterning a silicon nitride ($Si_3N_4$) layer and thermally oxidizing the exposed field oxide areas on the silicon substrate. This method is typically referred to in the semiconductor industry as the LOCal Oxidation of Silicon (LOCOS). After removing the silicon nitride layer, a thin gate oxide is formed on the silicon substrate in the device areas, and a first polysilicon layer, or alternatively a polycide layer, having a cap oxide ($SiO_2$) is patterned to form the FET gate electrodes and interconnecting word lines. Lightly doped source/drain areas are formed adjacent to the gate electrodes, usually by ion implantation of an N-type dopant, such as arsenic (As) or phosphorus (P), and then sidewall spacers are formed, usually by depositing an insulator such as silicon nitride ($Si_3N_4$) or silicon oxide ($SiO_2$) and anisotropically etching back to the substrate surface. The N-channel FETs are then completed by using a second N-type dopant implant to form the FET first and second source/drain contact areas adjacent to both sides of the gate electrode. A first insulating layer, such as silicon oxide, is then deposited to electrically insulate the source/drain contact areas. A second insulating layer, such as a borophosphosilicate glass (BPSG), is deposited on the substrate and is then planarized using an etch-back process. The bit line contact openings are now etched in the first and second insulating layers to the first of the source/drain contact areas of each FET. The bit lines are now formed by depositing a second polysilicon layer having a refractory metal silicide layer on its top surface to form a polycide layer. A third insulating layer is deposited next on the polycide, and these two layers are then patterned over the bit line contact openings to form the bit lines having electrical insulation on their top surface. A fourth relatively thick insulating layer, preferably composed of BPSG, is deposited over the bit lines and is planarized, for example, by chemical/mechanical polishing. A hard masking layer composed of polysilicon or silicon nitride is then deposited on the fourth insulating layer. Spin coating is then used to apply a photoresist layer and patterned to provide openings over the second of the two source/drain contact areas. These contact openings will eventually define the outer vertical portions of the crown-shaped stacked capacitors, and utilizing sidewall spacer technology, define smaller openings for the node contacts, thereby extending the photoresist resolution. Anisotropic plasma etching is now used to etch through the hard masking layer and to form a recess that extends partially into the fourth insulating layer. After removing the photoresist mask, for example by oxygen ashing, a conformal fifth insulating layer is deposited and anisotropically etched back to the recesses in the fourth insulating layer to form sidewall spacers in the recessed areas. A key point of this invention is that the sidewalls are selectively etched back using an etchant gas that has a higher etch-rate ratio of the hard mask (polysilicon or silicon nitride) to the sidewall spacer and to the underlying silicon oxide layer. A second key point of this invention is that a second selective plasma etch and the hard mask and sidewall spacers are used to etch through the remaining fourth insulating layer, the second insulating layer, and the first insulating layer to define the capacitor node contacts to the second of the source/drain contact areas. The etch selectivities are chosen to ensure that an insulating sidewall layer formed from the fourth insulating layer remains on the sidewalls of the bit lines. Continuing with the process, a conformal third polysilicon layer is deposited making contact to the second source/drain areas. A second masking layer, such as a photoresist or spin-on glass, is deposited and blanket etched back leaving portions of the masking layer over the third polysilicon layer in the node contact areas, while exposing the third polysilicon layer elsewhere on the substrate. The exposed third polysilicon layer is removed elsewhere from the substrate while the polysilicon is retained in the node contact openings. The second masking layer in the node contact openings and the hard mask and portions of the fourth insulating layer are etched thereby forming the array of bottom electrodes for the crown-shaped stacked capacitors. The capacitors are now completed by forming an interelectrode dielectric layer having a high dielectric constant on the surface of the bottom electrodes, and by depositing and patterning a fourth polysilicon layer to form the top electrodes to complete the crown-shaped stacked capacitors.

BRIEF DESCRIPTION OF THE DRAWINGS

The objects and advantages of this invention are best understood with reference to the attached drawings in the Figs. and the embodiment that follows.

DESCRIPTION OF THE PREFERRED EMBODIMENT

Now in keeping with the objects of this invention, the method for forming the crown-shaped stacked capacitors using a single photoresist masking level and high density plasma etching using a selective plasma etching process is covered in detail. These improved crown-shaped capacitors used on DRAM structures can be fabricated using N-channel FETs as the pass transistors that are currently used in manufacturing.

The DRAM structure is typically formed on a P-doped semiconductor substrate using N-channel field effect transistors (N-FET) as the pass transistors in each of the memory cells. It should also be well understood by one skilled in the art that by including additional process steps, in addition to those described in this embodiment, other types of devices can also be included on the DRAM chip. For example, by forming N-well regions in the P doped substrate, P-channel FETs can also be provided from which Complementary Metal-Oxide-Semiconductor (CMOS) circuits can be formed, such as are used for the peripheral circuits on the DRAM chip.

Figure 1:
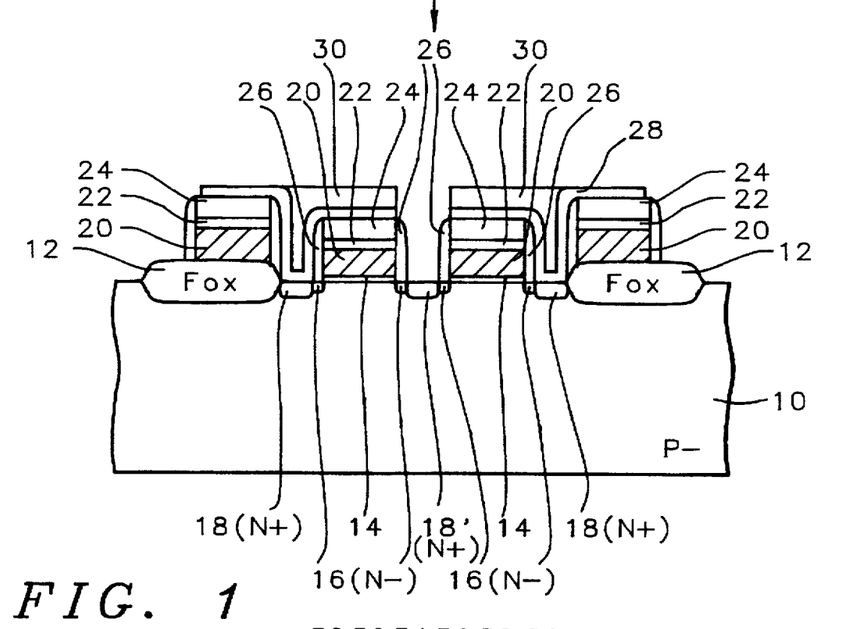
FIGS. 1 through 8 show schematic cross-sectional views for the sequence of processing steps for a portion of a DRAM device cell area having two crown-shaped storage capacitors and a common bit line.

Referring to FIG. 1, a schematic cross-sectional view of a portion of a semiconductor substrate 10 is shown having partially completed DRAM cells showing two pass transistors (N-channel FETs) formed on and in the substrate surface. The preferred substrate is usually composed of a lightly P-type single crystal silicon having preferably a <100> crystallographic orientation. A relatively thick Field OXide (FOX) 12 is formed surrounding and electrically isolating the individual device regions in which the memory cells are built. Portions of the field oxide 12 surrounding device regions are shown in FIG. 1. The FOX is most commonly formed by the LOCal Oxidation of Silicon (LOCOS) method. This LOCOS method involves depositing a thin silicon oxide (pad oxide) and a thicker silicon nitride layer as an oxidation barrier layer on the substrate surface (not shown in FIG. 1). Conventional photolithographic techniques and etching (also not shown in FIG. 1) are used to remove the barrier layer in areas where the field oxide is desired, while the silicon nitride is retained in areas where active devices are to be fabricated. The silicon substrate 10 is then subjected to a thermal oxidation to form the field oxide areas 12. Generally the oxide is grown to a thickness of between about 3000 and 6000 Angstroms.

The N-channel FETs are now formed in the active device regions after removing the silicon nitride barrier layer and pad oxide in a wet etch. For example, the silicon nitride can be removed in a hot phosphoric acid ($H_3PO_4$) etch at about 180° C., and the pad oxide can be removed in a dilute solution of hydrofluoric acid and water ($HF/H_2O$). A gate oxide 14 for the N-FETs is formed next in the device areas by thermally oxidizing the active device regions, as shown in FIG. 1. Typically, the thickness of the gate oxide 14 is between about 50 and 200 Angstroms. After further processing, only portions of the gate oxide 14 remain over the channel regions of the FET, as shown in FIG. 1.

Referring still to FIG. 1, the FET gate electrodes 20 in the device areas are formed next using conventional photolithographic techniques and plasma etching to pattern a multilayer composed of a first polysilicon layer 20 having a refractory metal silicide layer 22 on its surface, and a cap nitride layer 24. Portions of the word lines, also labeled 20, connecting the gate electrodes are formed concurrently over the FOX 12. The first polysilicon layer 20 is deposited, for example, using low pressure chemical vapor deposition (LPCVD) and a reactant gas, such as silane ($SiH_4$). The polysilicon layer 20 is doped with an N-type conductive dopant, for example, by ion implantation with arsenic ions ($As^{75}$) or phosphorus ions ($p^{31}$). Typically the polysilicon layer 20 is between about 500 and 1500 Angstroms thick, and is doped to a concentration of between about 1.0 E 19 to 1.0 E 21 atoms/cm$^3$. The refractory metal silicide layer 22, such as tungsten silicide (WSi$_2$), is formed on the polysilicon layer 20 to increase the electrical conductivity. For example, a tungsten metal can be physically deposited and then sintered to form the silicide. The tungsten can also be deposited by chemical vapor deposition (CVD) using tungsten hexafluoride (WF$_6$) as the reactant gas. The cap nitride layer 24, usually composed of a silicon nitride (Si$_3$N$_4$), can be deposited using LPCVD by decomposing a reactant gas, such as dichlorosilane (SiCl$_2$H$_2$) and ammonia (NH$_3$) and is provided over the gate electrodes 20 to electrically insulate them from portions of the bit lines that are later formed. Typically, the thickness of the cap nitride layer 24 is between about 1000 and 2000 Angstroms.

Lightly doped source/drain areas 16(N$^-$) are formed next adjacent to the gate electrodes 20. The lightly doped source/drain areas for the N-FETs are formed by ion implantation of an N-type dopant such as arsenic or phosphorus. For example, a typical implant might consist of phosphorus p$^{31}$ at a dose of between 1.0 E 13 and 1.0 E 14 atoms/cm$^2$ and an energy of between about 30 and 80 KeV. The gate electrodes serve as an implant mask to self-align the source/drain to the electrode, while an additional photo-resist mask can be used to avoid unwanted implants elsewhere on the substrate.

After forming the lightly doped source/drains 16(N$^-$), sidewall spacers 26 are formed on the sidewalls of the gate electrodes 20, also shown in FIG. 1. These sidewall spacers are typically formed by depositing a low-temperature silicon nitride, and then anisotropically etching back to the silicon surface. For example, the silicon nitride can be deposited using LPCVD and NH$_3$/SiCl$_2$H$_2$ at a temperature in the range of about 650° to 900° C., and the etch back is performed in a low pressure reactive ion etcher. Alternatively, the sidewall spacers can be formed from silicon nitride. An N$^+$ source/drain ion implantation is then used to complete the source/drain areas forming the N$^+$ doped source/drain contact areas 18(N$^+$) and 18' (N$^+$) aligned to the sidewall spacers 26, and therefore also aligned to the lightly doped source/drain areas 16(N$^-$), as depicted in FIG. 1.

Still referring to FIG. 1, a first insulating layer 28 is conformally deposited on the substrate 10 as an electrical insulating layer over the exposed source/drain contacts. The first insulating layer 28 is preferably composed of a LPCVD silicon oxide (e.g., TEOS oxide) and has a preferred thickness of between about 500 and 2000 Angstroms.

Referring still to FIG. 1, a doped second insulating layer 30 is deposited. Preferably insulating layer 30 is composed of a low-flow temperature glass, such as borophosphosilicate glass (BPSG), which is then planarized either by thermal annealing or etch back. For example, the BPSG can be deposited by LPCVD using a reactant gas such as TEOS to which are added dopant gases such as phosphine (PH$_3$) and diborane (B$_2$H$_6$) to the TEOS gas flow during deposition. The BPSG is then annealed to achieve a more planar surface. If planarizing by etch back is used, a planarizing layer, such as photoresist, can be used. The thickness of layer 30 is typically between about 1000 and 2000 Angstroms.

Still referring to FIG. 1, conventional photolithographic techniques and anisotropic plasma etching are used to form bit line contact openings 2 in layers 30 and 28 to the source/drain areas 18'(N$^+$). For example, the plasma etching can be carried out in a high density plasma etcher using an etchant gas such as carbon tetrafluoride (CF$_4$).

Figure 2:
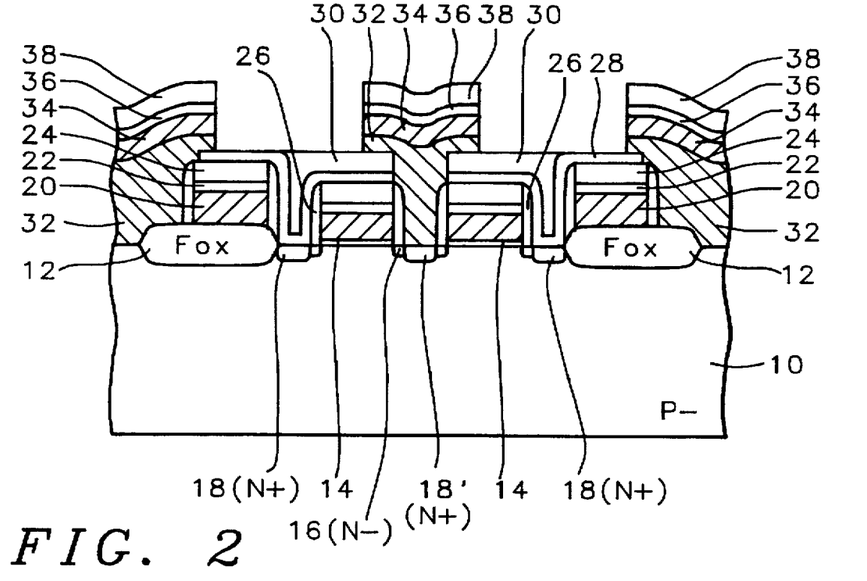

Referring now to FIG. 2, the bit lines are formed making contact to the source/drain areas 18'(N$^+$). The bit lines are formed by depositing a conformal second polysilicon layer 32, and forming on the surface a refractory metal silicide layer 34 to improve electrical conductivity. The preferred method of depositing polysilicon layer 32 is by LPCVD and is in-situ doped N$^+$. For example, phosphorus can be incorporated into the layer by adding a phosphine (PH$_3$) gas to the silane (SiH$_4$) during the LPCVD process. The preferred thickness of second polysilicon layer 32 is between about 1000 and 2000 Angstroms. The silicide layer 34 is preferably tungsten silicide (WSi$_2$). For example, the WSi$_2$ can be deposited by chemical vapor deposition (CVD) using a reactant gas such as tungsten hexafluoride (WF$_6$). The silicide layer 34 is deposited to a thickness of between about 1000 and 2000 Angstroms. Next, a third insulating layer 36 is deposited over the silicide layer 34. Preferably the third insulating layer is a multilayer composed of silicon oxide 36 having a silicon nitride 38 on its surface. Layer 36 has a thickness of between about 100 and 500 Angstroms, and layer 38 has a thickness of between about 1000 and 2000 Angstroms. The silicon oxide 36 is deposited by LPCVD using, for example, TEOS, and the silicon nitride 38 can also be deposited by LPCVD using, for example, a reactant gas mixture such as dichlorosilane (SiCl$_2$H$_2$) and ammonia (NH$_3$). Also as shown in FIG. 2, conventional photolithographic techniques and plasma etching are then used to pattern the third insulating layer (36 and 38) and the polycide layer (32 and 34) down to the second insulating layer 30 to complete the formation of the bit lines.

Figure 3:
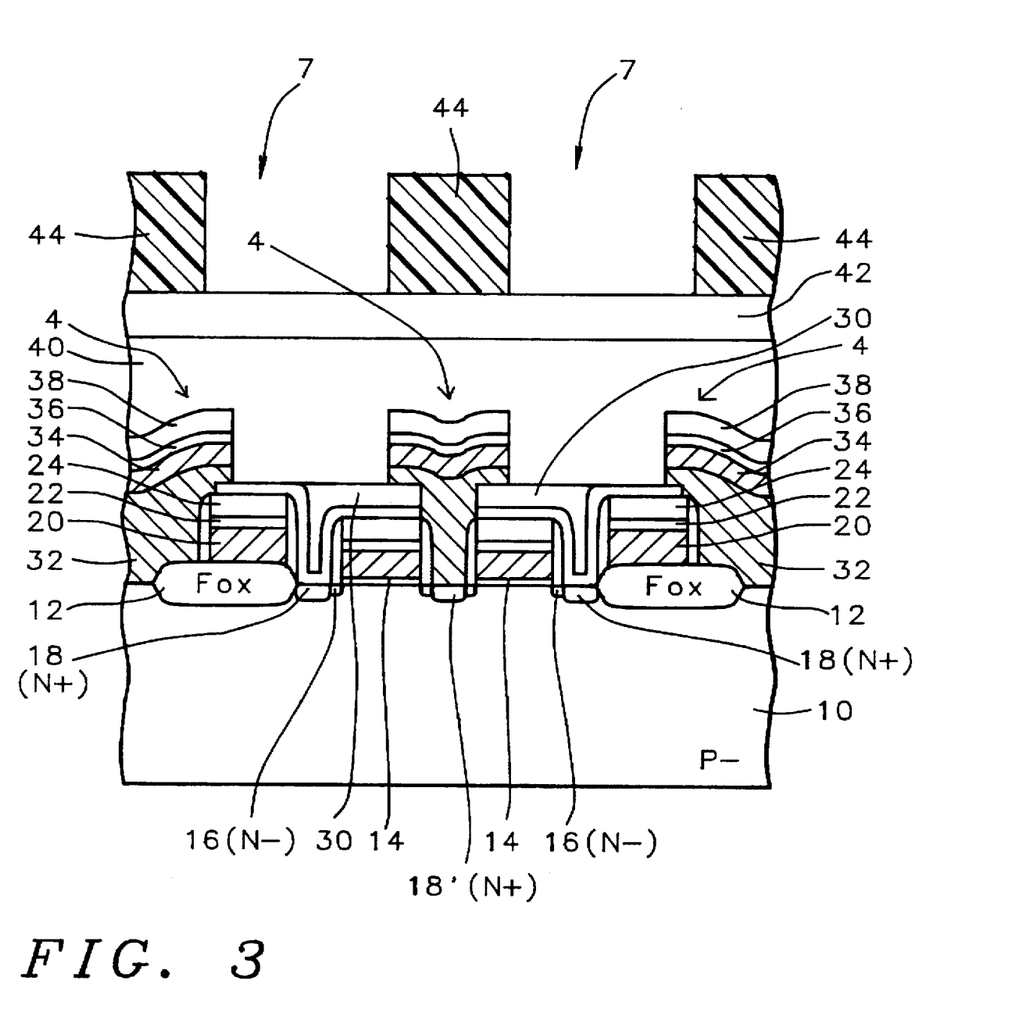

Referring to FIG. 3, the formation of the crown-shaped capacitors, by the method of this invention, is now described. Continuing, a relatively thick fourth insulating layer 40 is deposited over the bit lines 4 and planarized. Preferably layer 40 is a low-flow temperature glass such as BPSG. For example, one can deposit the BPSG by LPCVD and using a reactant gas such as TEOS to which are added dopant gases such as phosphine (PH$_3$) and diborane (B$_2$H$_6$) to the TEOS gas flow. The BPSG can then be annealed at a temperature of between about 800° and 900° C. for a time of between about 30 and 60 minutes to achieve a more planar surface. Preferably the thickness of layer 40 over the bit line regions is between about 4000 and 9000 Angstroms after planarizing.

Next, as shown in FIG. 3, a hard-mask layer 42 is deposited on the planar fourth insulating layer 40. The preferred composition of the hard mask is an undoped polysilicon, or alternatively a silicon nitride layer. The polysilicon can be deposited by LPCVD using a reactant gas such as silane. The silicon nitride layer can be also deposited by LPCVD using SiCl$_2$H$_2$ and NH$_3$. The preferred thickness of the polysilicon hard-mask layer 42 is between about 2000 and 3000 Angstroms, and the preferred thickness of the silicon nitride hard-mask layer is between about 2000 and 4000 Angstroms.

Still referring to FIG. 3, using conventional photolithographic techniques, a patterned photoresist mask 44 is formed on the hard-mask layer 42 having openings 7 over the second of the source/drain contact areas 18(N$^+$). The openings 7 in the photoresist will eventually define the dimensions of the outer vertical portions of the crown-shaped stacked capacitors.

Figure 4:
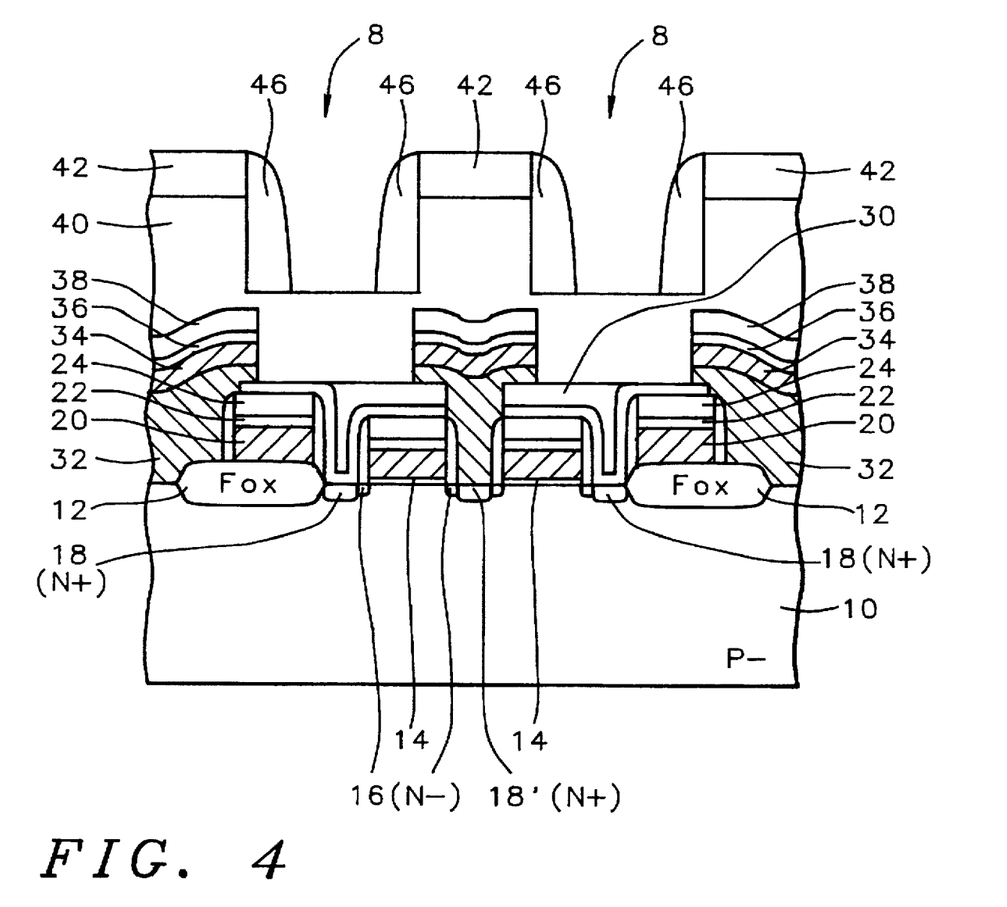

Referring to FIG. 4, utilizing the photoresist mask 44 (FIG. 3), anisotropic plasma etching is now used to etch through the hard masking layer 42 and etching is continued to partially etch into the fourth insulating layer 40 to form recesses 8 having essentially vertical sidewalls. The recesses in insulating layer 40 are etched to a depth of between about 2000 and 4000 Angstroms. Preferably the etching is carried out in a high density plasma etcher using an etchant gas such as carbon hexafluoride ($C_2F_6$).

The photoresist mask is then removed, for example by oxygen ashing. A conformal fifth insulating layer 46 is deposited over the recesses 8 and anisotropically etched back to form sidewall spacers 46 on the sidewalls of the recesses in layer 40 and on the sidewalls of the hard mask 42. If the hard mask 42 is composed of polysilicon, the fifth insulating layer 46 is preferably composed of a silicon nitride, and if the hard mask 42 is silicon nitride, the fifth insulating layer 46 is preferably composed of silicon oxide. For example, the silicon oxide can be deposited by LPCVD using a reactant gas such as TEOS, and the silicon nitride can also be deposited by LPCVD using $SiCl_2H_2$ and $NH_3$. The fifth insulating layer 46 is now etched back to form the sidewall spacers 46. More specifically and a key feature of this invention, if the hard mask 42 is polysilicon, the etch-rate ratio of the polysilicon to the silicon nitride spacers to the underlying oxide is between about 2:1:1 and 20:10:1. However, if the hard mask 42 is silicon nitride, then the etch-rate ratio of the silicon nitride to the silicon oxide spacers to the underlying oxide is preferably between about 2:1:1 and 10:1:1. The etching can be carried out preferably in a high density plasma mode using a gas mixture of carbon tetra-fluoride ($CF_4$), trifluoromethane ($CHF_3$), and argon (Ar).

Figure 5:
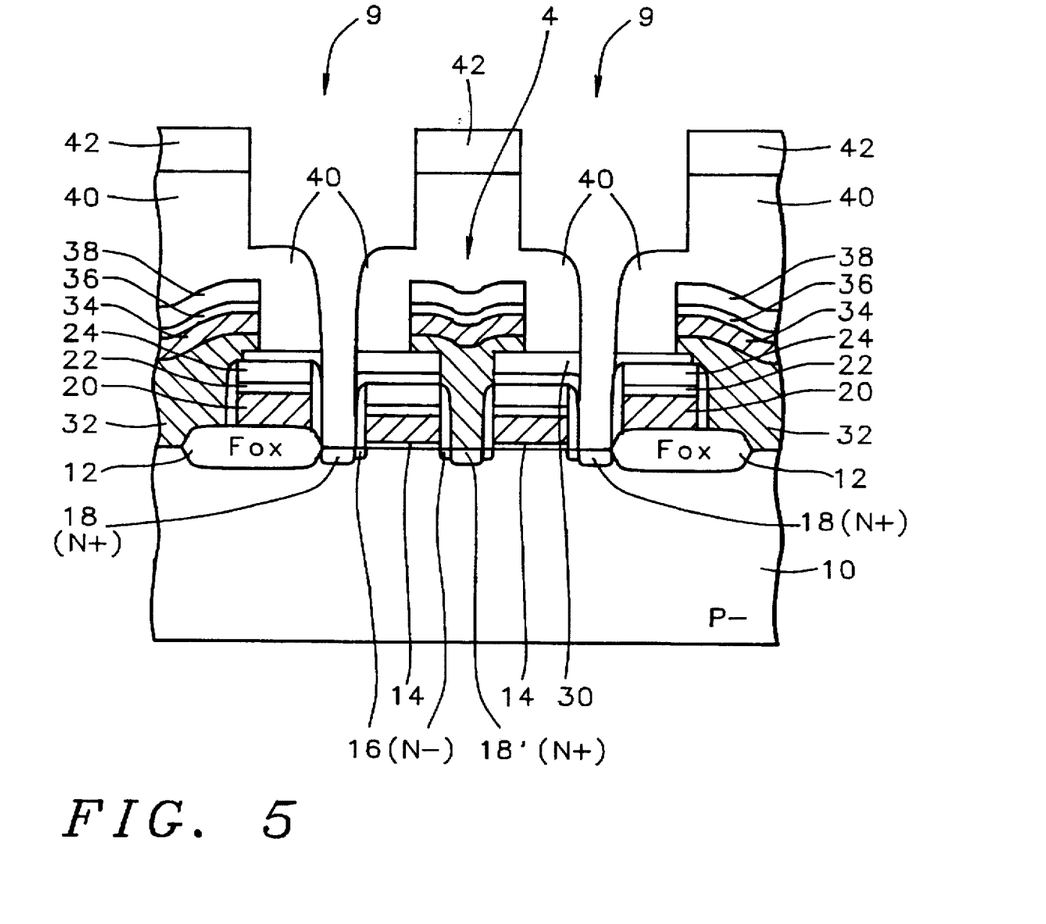

Referring to FIG. 5, another key feature of this invention is that a second selective plasma etching is now carried out using the hard mask 42 and sidewall spacers 46 to form contact openings to the source/drain areas 18($N^+$) through the remaining fourth insulating layer 40, the second insulating layer 30, and the first insulating layer 28 to define the capacitor node contact openings. The etch selectivities are chosen to ensure that an insulating sidewall layer composed of portions of fourth insulating layer 40 remains on the sidewalls of the bit lines 4 to prevent electrical shorting to the capacitor bottom electrode to be formed next. Preferably the plasma etching is carried out in a high density plasma etcher using a gas mixture composed of oxygen, trifluoromethane, carbon tetrafluoride, carbon monoxide, perfluoroisobutylene, and argon ($O_2/CHF_3/CF_4/CO/C_4F_8/Ar$) and the etcher processing parameters are adjusted to provide an etch-rate ratio for polysilicon hard mask to silicon nitride spacers to the underlying silicon oxide of between about 2:1:1 and 20:1:1. One other important feature of the invention is that the sidewalls extend the resolution of the photoresist mask thereby making smaller contact openings. By way of example only, if the photoresist opening is 0.35 um wide, and the sidewall spacers 46 are 0.05 um wide, then the node contact openings can be made as small 0.25 um. Another important feature is that the aspect ratio of the node contact opening 9 is reduced because of the wider aperture at the top of the opening 9.

Figure 6:
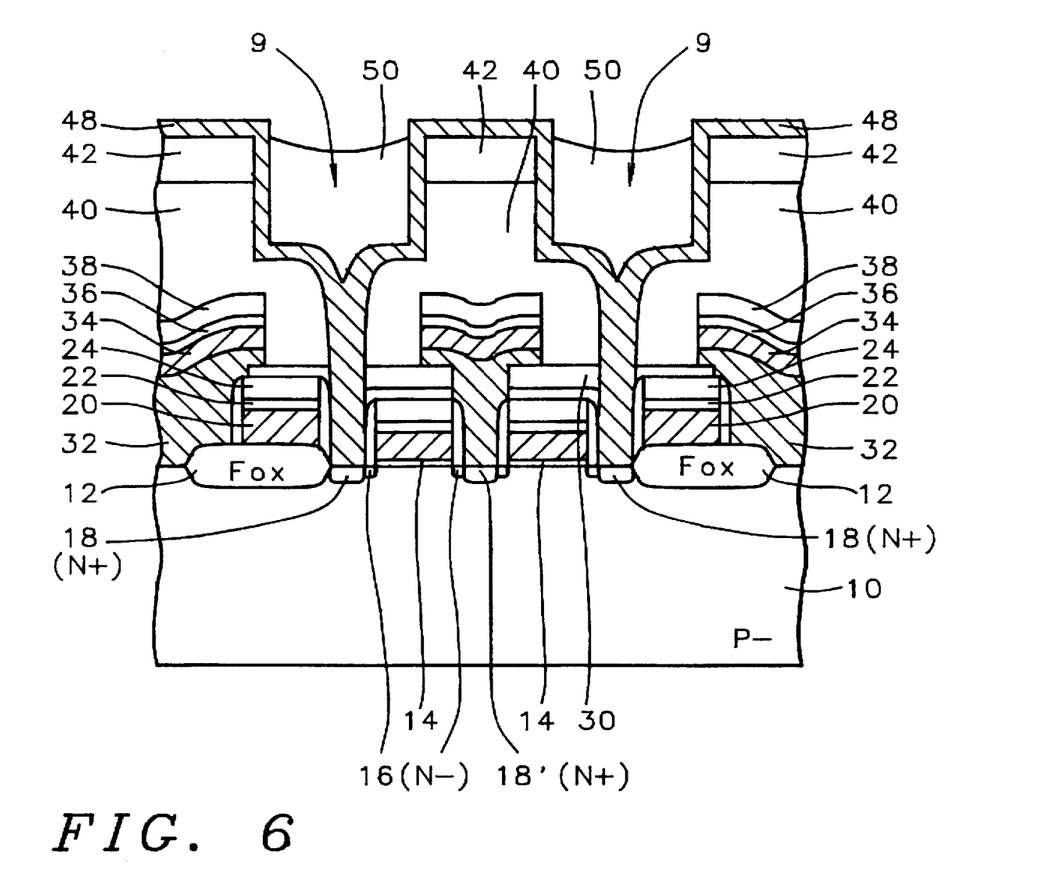

Referring to FIG. 6, and continuing with the process, a conformal third polysilicon layer 48 is deposited over and in the node contact openings 9. Therefore, layer 48 makes electrical contact to the second source/drain areas 18($N^+$). Polysilicon layer 48 is deposited by LPCVD using, for example, silane as the reactant gas. The polysilicon is preferably in-situ doped $N^+$ by adding to the silane during deposition a dopant gas such as phosphine ($PH_3$). The preferred dopant concentration of layer 48 is between about 1.0 E 19 and 1.0 E 21 atoms/$cm^3$. The thickness of layer 48 is preferably between about 500 and 1000 Angstroms.

A second masking layer 50 is deposited next, and essentially has a planar surface. For example, layer 50 can be composed of a photoresist or a spin-on glass applied by spin coating. Alternatively, BPSG can be deposited by LPCVD and annealed to form a planar surface. Layer 50 is t hen blanket etched back leaving portions of the masking layer over the third polysilicon layer 48 in the node contact openings 9, while exposing the third polysilicon layer elsewhere on the substrate 10, as shown in FIG. 6. For example, when photoresist is used as the masking layer 50, the etch back can be achieved by plasma ashing: when a silicon oxide (BPSG) is used, the etch back can be achieved by plasma etching in a gas such as $CF_4$. When polysilicon is used as the hard mask 42, then the exposed polysilicon layer 48 and the hard mask 42 can be concurrently etched to the surface of the fourth insulating layer 40 while the second masking layer protects the third polysilicon layer from being etched in the node contact openings 9. The fourth insulating layer (BPSG) is then removed to the surface of the silicon nitride layer 38, for example by using a wet etch such as hydrofluoric acid (HF).

Figure 7:
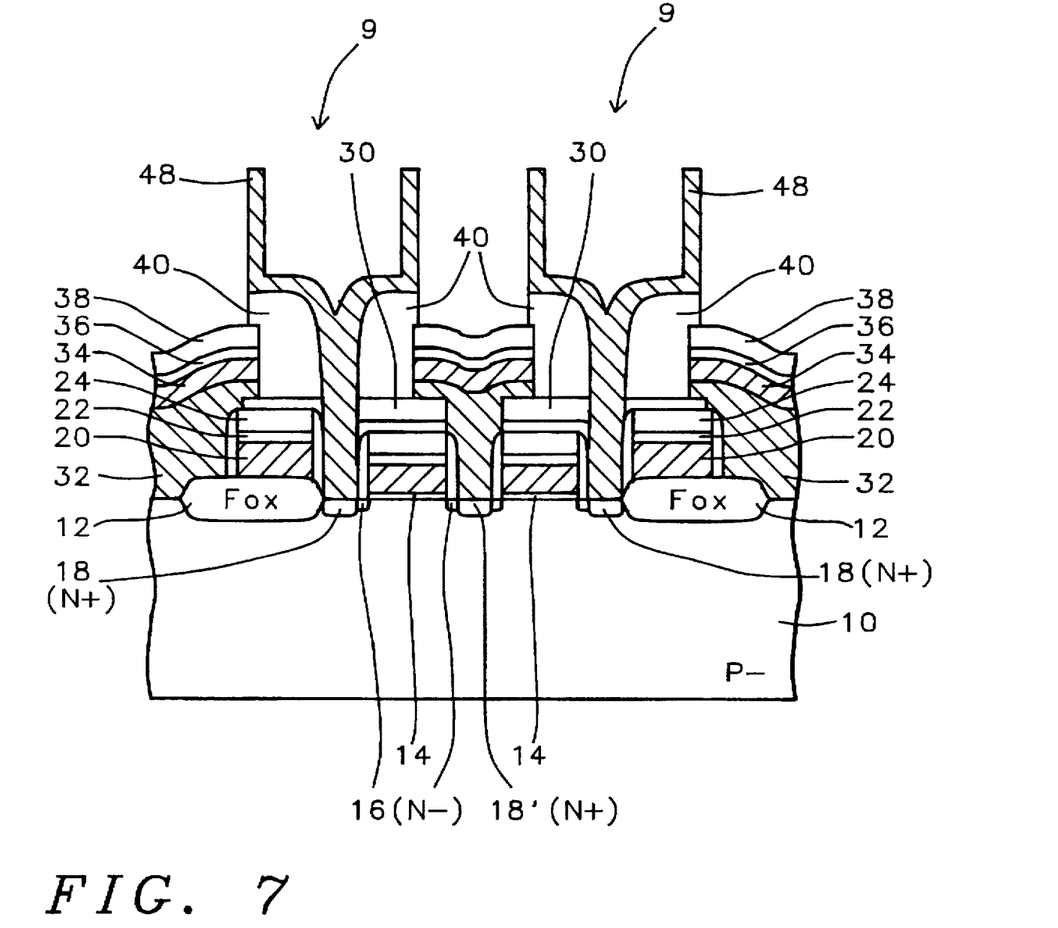

Now as shown in FIG. 7, the second masking layer 50 is removed from within the node contact openings 9. For example, when the second masking material is photoresist, the masking layer 50 can be removed by plasma ashing in oxygen. On the other hand, when the second masking material is a silicon oxide a hydrofluoric (HF) acid solution can be used to remove the mask. This provides a high density of bottom electrodes for the crown-shaped stacked capacitors formed from the third polysilicon layer 48, two of which are depicted in the Figure.

Figure 8:
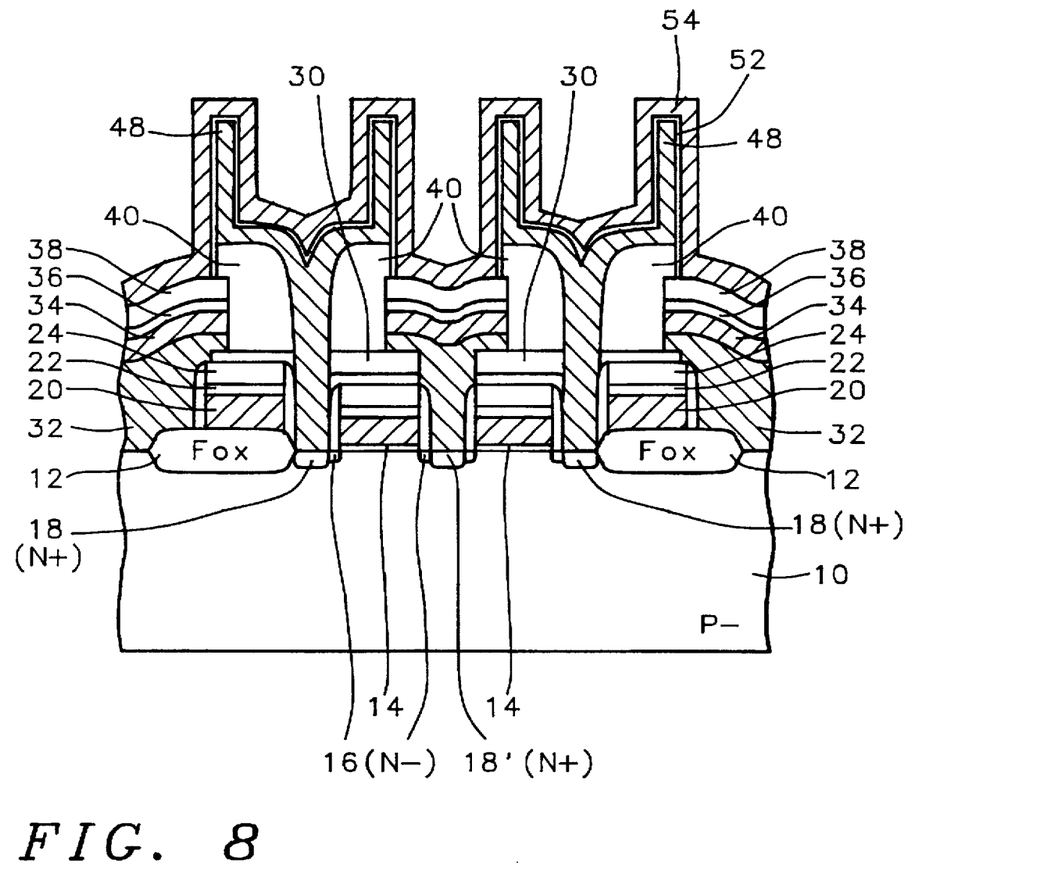

Referring to FIG. 8, a thin interelectrode dielectric layer 52 is formed on the surface of the array of bottom electrodes. The thin dielectric layer is preferably between about 40 and 60 Angstroms thick, and is composed of a material having a high dielectric constant and is compatible with the polysilicon process and is continuous and pin hole free. The preferred dielectric layer is composed of silicon oxide-silicon nitride (ON) or a silicon oxide-silicon nitride-silicon oxide (ONO) layer. For example the surface of the polysilicon bottom electrodes can be thermally annealed in an oxygen ambient to form the silicon oxide and then a thin layer of silicon nitride can be deposited using LPCVD to form the ON. To form the ONO layer, the exposed surface of the silicon nitride can be reduced in an oxidizing ambient at elevated temperatures. Additionally, the surface of the polysilicon electrodes can be roughened to further increase surface area. Alternatively, other insulating materials having a high dielectric constant can be used, such as tantalum pentoxide ($Ta_2O_5$).

Also shown in FIG. 8, a conformal fourth poly-silicon layer 54 is deposited on the interelectrode dielectric layer 52. Layer 54 conformally covers the bottom electrode having the interelectrode dielectric on the surface, and forms the top electrode for storage capacitors. Layer 54 is preferably deposited by LPCVD and is in-situ doped N-type. The preferred thickness of polysilicon layer 54 is between about 1000 and 2000 Angstroms and is doped with an N-type dopant impurity, such as with phosphorus (P). The preferred concentration of phosphorus in layer 54 is in the range of between about 5.0 E 19 to 1.0 E 21 atoms/cm The polysilicon layer 54 is then patterned using conventional photolithographic techniques and plasma etching to form the top electrodes and to complete the crown-shaped array of storage capacitors. Two adjacent capacitors of the array of capacitors are depicted in FIG. 8.

While the invention has been particularly shown and described with reference to the preferred embodiment thereof, it will be understood by those skilled in the art that various changes in form and details may be made without departing from the spirit and scope of the invention.

What is claimed is:

1. A method for manufacturing crown-shaped stacked capacitors for an array of dynamic random access memory (DRAM) cells on a semiconductor substrate comprising the steps of:

providing a semiconductor substrate having device areas surrounded and electrically isolated from each other by field oxide areas;

providing field effect transistors (FETs) in said device areas, each of said transistors having a gate electrode formed from a patterned first polysilicon layer, and having first and second source/drain contact areas in said device areas, and electrically insulated by depositing a conformal first insulating layer thereon;

forming a planarized second insulating layer on said first insulating layer;

photoresist masking and anisotropically etching contact openings to said first source/drain contact areas of each said FET, thereby forming bit line contact openings for bit lines;

depositing a conformal second polysilicon layer on said substrate having a refractory metal silicide layer thereon;

depositing a third insulating layer on said silicide layer;

patterning said third insulating layer and said second polysilicon layer using photoresist masking and anisotropic plasma etching leaving portions of said second polysilicon layer over and in said first source/drain contact areas thereby forming bit lines for said DRAM cells;

depositing a fourth insulating layer over said bit lines and planarizing said fourth insulating layer;

depositing a hard masking layer on said planar fourth insulating layer;

forming a patterned photoresist layer on said hard masking layer having openings over said second source/drain contact areas;

anisotropic etching through said hard masking layer and partially recessing into said fourth insulating layer in said photoresist openings;

removing said photoresist masking layer;

depositing a conformal fifth insulating layer and blanket anisotropically etching back to form sidewall spacers in said recessed areas and exposing said fourth insulating layer between said sidewall spacers in said openings;

anisotropically and selectively etching said fourth and second insulating layers in said openings to said second source/drain contact areas thereby forming contact openings that exceed the resolution limit of said patterned photoresist layer while providing wider openings that reduce the aspect ratio in said fourth insulating layer;

depositing a conformal third polysilicon layer in said second source/drain contact openings and elsewhere on said substrate;

depositing a second masking layer and blanket etching back leaving portions in said second source/drain contact openings while exposing said third polysilicon layer elsewhere on said substrate;

etching back said third polysilicon layer and said hard masking layer to said fourth insulating layer;

selectively remove by etching said second masking layer and said fourth insulating layer thereby forming bottom electrodes for said crown-shaped stacked capacitors;

forming an interelectrode dielectric layer on said bottom electrodes;

depositing and patterning a fourth polysilicon layer thereby forming top electrodes and completing said crown-shaped stacked capacitors.

2. The method of claim 1, wherein said first, second, third, and fourth polysilicon layers are doped with $N^+$ type electrically conducting dopant having a concentration of between about $1.0\ E\ 19$ and $1.0\ E\ 21$ atoms/cm$^3$.

3. The method of claim 1, wherein said second polysilicon layer having said refractory metal silicide layer thereon has a total thickness of between about 2000 and 4000 Angstroms.

4. The method of claim 1, wherein said fourth insulating layer is composed of a planarized borophosphosilicate glass (BPSG) having a thickness of between about 4000 and 9000 Angstroms.

5. The method of claim 1, wherein said hard masking layer is composed of a polysilicon having a thickness of between about 2000 and 3000 Angstroms.

6. The method of claim 1, wherein said recess in said fourth insulating layer is between about 2000 and 4000 Angstroms deep.

7. The method of claim 1, wherein said sidewall spacers are composed of silicon nitride ($Si_3N_4$).

8. The method of claim 1, wherein said sidewall spacers are composed of silicon oxide ($SiO_2$).

9. The method of claim 1, wherein said sidewall spacers are etched having an etch rate ratio of polysilicon to silicon nitride to silicon oxide of between about 2:1:1 and 20:10:1.

10. The method of claim 1, wherein said selective etching of said first and second insulating layers to said second source/drain contact areas is carried out in an etchant gas mixture composed of oxygen, trifluoromethane, carbon tetrafluoride, carbon monoxide, perfluoroisobutylene, and argon ($O_2$/$CHF_3$/$CF_4$/$CO$/$C_4F_8$/$Ar$).

11. The method of claim 10, wherein said selective etching provides an etch rate ratio of polysilicon to silicon nitride to silicon oxide of between about 2:1:1 and 20:1:1.

12. The method of claim 1, wherein said third polysilicon layer has a thickness of between about 500 and 1000 Angstroms.

13. The method of claim 1, wherein said second masking layer is composed of a photoresist.

14. The method of claim 1, wherein said interelectrode dielectric layer is between about 40 and 60 Angstroms thick.

15. The method of claim 1, wherein said fourth polysilicon layer is between about 1000 and 2000 Angstroms thick.

16. A method for manufacturing crown-shaped stacked capacitors for an array of dynamic random access memory (DRAM) cells on a semiconductor substrate comprising the steps of:

providing a semiconductor substrate having device areas surrounded and electrically isolated from each other by field oxide areas;

providing field effect transistors (FETs) in said device areas, each of said transistors having a gate electrode formed from a patterned first polysilicon layer, and having first and second source/drain contact areas in said device areas, and electrically insulated by depositing a conformal first insulating layer thereon;

forming a planarized second insulating layer on said first insulating layer;

photoresist masking and anisotropically etching contact openings to said first source/drain contact areas of each said FET, thereby forming bit line contact openings for bit lines;

depositing a conformal second polysilicon layer on said substrate having a refractory metal silicide layer thereon;

depositing a third insulating layer on said silicide layer;

patterning said third insulating layer and said second polysilicon layer using photoresist masking and anisotropic plasma etching leaving portions of said second polysilicon layer over and in said first source/drain contact areas thereby forming bit lines for said DRAM cells;

depositing a fourth insulating layer over said bit lines and planarizing said fourth insulating layer;

depositing a hard masking layer composed of silicon nitride on said planar fourth insulating layer;

forming a patterned photoresist layer on said hard masking layer having openings over said second source/drain contact areas;

anisotropic etching through said hard masking layer and partially recessing into said fourth insulating layer in said photoresist openings;

removing said photoresist masking layer;

depositing a conformal fifth insulating layer and blanket anisotropically etching back to form sidewall spacers in said recessed areas and exposing said fourth insulating layer between said sidewall spacers in said openings;

anisotropically and selectively etching said fourth and second insulating layers in said openings to said second source/drain contact areas thereby forming contact openings that exceed the resolution limit of said patterned photoresist layer while providing wider openings that reduce the aspect ratio in said fourth insulating layer;

depositing a conformal third polysilicon layer in said second source/drain contact openings and elsewhere on said substrate;

depositing a second masking layer and blanket etching back leaving portions in said second source/drain contact openings while exposing said third polysilicon layer elsewhere on said substrate;

etching back said third polysilicon layer to said hard masking layer;

selectively removing by etching said hard mask, said second masking layer, and said fourth insulating layer thereby forming bottom electrodes for said crown-shaped stacked capacitors;

forming an interelectrode dielectric layer on said bottom electrodes;

depositing and patterning a fourth polysilicon layer thereby forming top electrodes and completing said crown-shaped stacked capacitors.

17. The method of claim 16, wherein said first, second, third, and fourth polysilicon layers are doped with $N^+$ type electrically conducting dopant having a concentration of between about 1.0 E 19 and 1.0 E 21 atoms/cm$^3$.

18. The method of claim 16, wherein said second polysilicon layer having said refractory metal silicide layer thereon has a total thickness of between about 2000 and 4000 Angstroms.

19. The method of claim 16, wherein said third insulating layer is composed of a multilayer of silicon oxide and an upper layer of silicon nitride.

20. The method of claim 16, wherein said fourth insulating layer is composed of a planarized borophosphosilicate glass (BPSG) having a thickness of between about 4000 and 9000 Angstroms.

21. The method of claim 16, wherein said hard masking layer has a thickness of between about 2000 and 4000 Angstroms.

22. The method of claim 16, wherein said recess in said fourth insulating layer is between about 2000 and 4000 Angstroms deep.

23. The method of claim 16, wherein said sidewall spacers are composed of silicon nitride ($Si_3N_4$).

24. The method of claim 16, wherein said sidewall spacers are composed of silicon oxide ($SiO_2$).

25. The method of claim 16, wherein said sidewall spacers are etched having an etch rate ratio of polysilicon to silicon nitride to silicon oxide of between about 2:1:1 and 10:1:1.

26. The method of claim 16, wherein said selective etching of said first and second insulating layers to said second source/drain contact areas is carried out in an etchant gas mixture composed of oxygen, trifluoromethane, carbon tetrafluoride, carbon monoxide, perfluoroisobutylene, and argon ($O_2/CHF_3/CF_4/CO/C_4F_8/Ar$).

27. The method of claim 26, wherein said selective etching provides an etch rate ratio of polysilicon to silicon nitride to silicon oxide of between about 2:1:1 and 20:1:1.

28. The method of claim 16, wherein said third polysilicon layer has a thickness of between about 500 and 1000 Angstroms.

29. The method of claim 16, wherein said second masking layer is composed of a spin-on glass (SOG).

30. The method of claim 16, wherein said second masking layer is composed of a borophosphosilicate glass (BPSG).

31. The method of claim 16, wherein said interelectrode dielectric layer is between about 40 and 60 Angstroms thick.

32. The method of claim 16, wherein said fourth polysilicon layer is between about 1000 and 3000 Angstroms thick.

* * * * *